(12) United States Patent
Jung

(10) Patent No.: US 11,233,033 B2
(45) Date of Patent: Jan. 25, 2022

(54) SEMICONDUCTOR PACKAGES INCLUDING CHIPS STACKED ON A BASE MODULE

(71) Applicant: SK hynix Inc., Icheon-si (KR)

(72) Inventor: Won Duck Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/899,149

(22) Filed: Jun. 11, 2020

(65) Prior Publication Data
US 2021/0233891 A1    Jul. 29, 2021

(30) Foreign Application Priority Data
Jan. 28, 2020  (KR) .......................... 10-2020-0010124

(51) Int. Cl.
*H01L 25/065* (2006.01)
(52) U.S. Cl.
CPC .. *H01L 25/0652* (2013.01); *H01L 2225/0651* (2013.01); *H01L 2225/06517* (2013.01); *H01L 2225/06548* (2013.01); *H01L 2225/06555* (2013.01); *H01L 2225/06586* (2013.01)
(58) Field of Classification Search
CPC ............... H01L 25/065; H01L 25/0652; H01L 2225/0651; H01L 2225/06548; H01L 2225/06555
See application file for complete search history.

(56) References Cited

U.S. PATENT DOCUMENTS

| 9,337,170 | B1 * | 5/2016 | Sun ..................... H01L 25/0655 |
| 10,319,698 | B2 * | 6/2019 | Cheah .................... H01L 24/33 |
| 2014/0103523 | A1 * | 4/2014 | Jang .................... H01L 25/0652 257/737 |
| 2014/0147972 | A1 * | 5/2014 | Semmelmeyer ......... H05K 1/11 438/109 |
| 2015/0216030 | A1 * | 7/2015 | Semmelmeyer .... H01L 25/0652 361/803 |

FOREIGN PATENT DOCUMENTS

| KR | 101394203 B1 | 5/2014 |
| KR | 1020150125960 A | 11/2015 |

\* cited by examiner

*Primary Examiner* — Marcos D. Pizarro
*Assistant Examiner* — William Henry Anderson
(74) *Attorney, Agent, or Firm* — William Park & Associates Ltd.

(57) ABSTRACT

A semiconductor package includes a package substrate, a base module disposed on the package substrate and configured to include an intermediate chip, bonding wires connecting the intermediate chip to the package substrate, a lower-left chip disposed between the base module and the package substrate, and an upper-left chip disposed on the base module. The base module further includes an encapsulant encapsulating the intermediate chip, through vias electrically connected to the upper-left chip, and redistributed lines (RDLs) connecting the intermediate chip to the through vias and extending to provide connection parts which are spaced apart from the through vias and are connected to the lower-left chip.

20 Claims, 8 Drawing Sheets

SEMICONDUCTOR PACKAGES INCLUDING CHIPS STACKED ON A BASE MODULE

CROSS-REFERENCE TO RELATED APPLICATIONS

The present application claims priority under 35 U.S.C 119(a) to Korean Application No. 10-2020-0010124, filed on Jan. 28, 2020, which is incorporated herein by references in its entirety.

BACKGROUND

1. Technical Field

The present disclosure relates to semiconductor package technologies and, more particularly, to semiconductor packages including a plurality of chips stacked on a base module.

2. Related Art

Recently, a lot of effort has been focused on integrating a plurality of semiconductor chips into one semiconductor package. That is, attempts to increase package integration density have been made to realize high performance semiconductor packages that process a large amount of data at a high speed. For example, a stack package structure including a plurality of vertically stacked semiconductor chips has been proposed to realize the high performance semiconductor packages. Various interconnection structures have been proposed to electrically connect the vertically stacked semiconductor chips to each other.

SUMMARY

According to an embodiment, a semiconductor package includes a package substrate, a base module disposed on the package substrate, a lower-left chip and a lower-right chip disposed between the base module and the package substrate, and an upper-left chip disposed on the base module opposite to the lower-left chip. The base module includes an intermediate chip having a first intermediate chip pad and a second intermediate chip pad, an encapsulant encapsulating the intermediate chip, a first through via and a second through via penetrating the encapsulant to be electrically connected to the upper-left chip, and a first redistributed line (RDL) and a second RDL configured to connect the first and second intermediate chip pads to respective ones of the first and second through vias and configured to be electrically connected to the lower-left chip and the lower-right chip.

According to another embodiment, a semiconductor package includes a package substrate, a base module disposed on the package substrate and configured to include an intermediate chip, bonding wires connecting the intermediate chip to the package substrate, a lower-left chip disposed between the base module and the package substrate, and an upper-left chip disposed on the base module opposite to the lower-left chip. The intermediate chip includes a first intermediate chip pad, a second intermediate chip pad, and wire bonding pads disposed to be spaced apart from the first and second intermediate chip pads and connected to the bonding wires. The lower-left chip includes a first lower-left chip pad corresponding to the first intermediate chip pad and a second lower-left chip pad corresponding to the second intermediate chip pad. The upper-left chip includes a first upper-left chip pad corresponding to the first intermediate chip pad and a second upper-left chip pad corresponding to the second intermediate chip pad. The base module further includes an encapsulant encapsulating the intermediate chip, a first through via and a second through via penetrating the encapsulant to be electrically connected to respective ones of the first upper-left chip pad and the second upper-left chip pad, a first redistributed line (RDL) configured to connect the first intermediate chip pad to the first through via and configured to extend to provide a first connection part which is spaced apart from the first through via and is connected to the first lower-left chip pad, and a second RDL configured to connect the second intermediate chip pad to the second through via and configured to extend to provide a second connection part which is disposed between the second through via and the first connection part and is connected to the second lower-left chip pad.

According to yet another embodiment, a semiconductor package includes a package substrate, a base module disposed on the package substrate and configured to include an intermediate chip, bonding wires connecting the intermediate chip to the package substrate, a lower-left chip disposed between the base module and the package substrate, and an upper-left chip disposed on the base module. The base module further includes an encapsulant encapsulating the intermediate chip, through vias penetrating the encapsulant to be electrically connected to the upper-left chip, and redistributed lines (RDLs) configured to connect the intermediate chip to the through vias and configured to extend to provide connection parts which are spaced apart from the through vias and are connected to the lower-left chip.

DETAILED DESCRIPTION OF THE EMBODIMENTS

Figure 1:
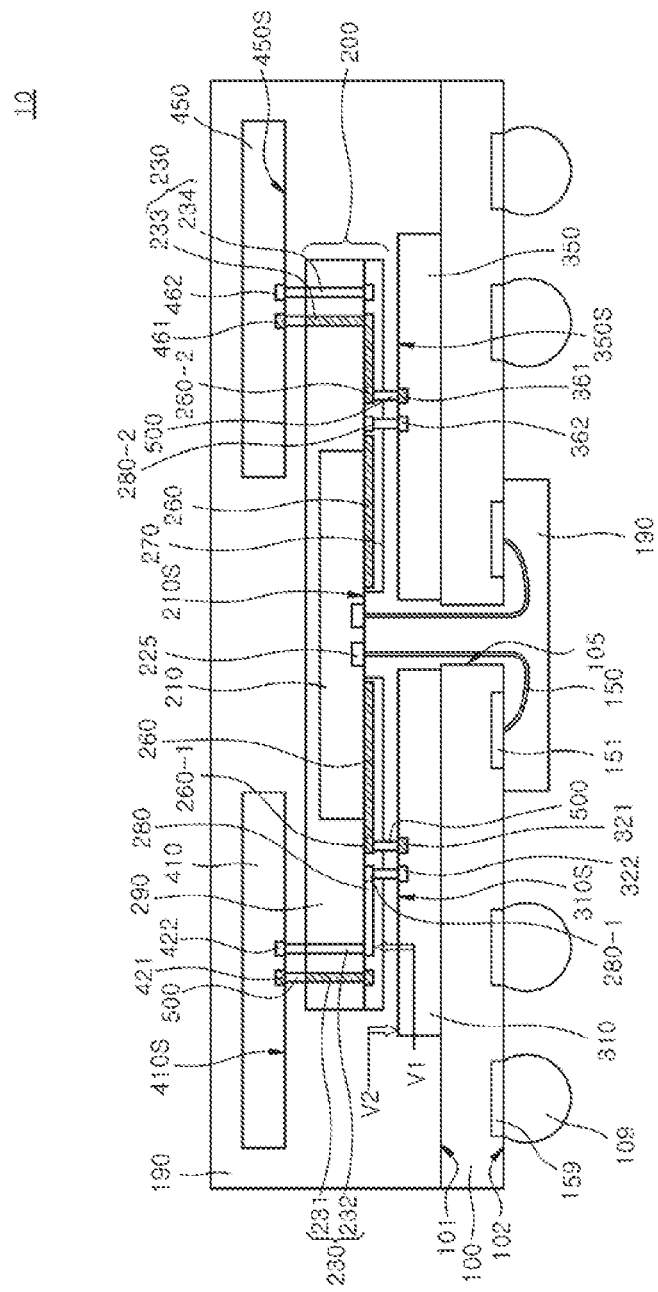
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms)

used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

In the following embodiments, a semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs), or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be shown drawing.

FIG. 1 is a cross-sectional view illustrating a semiconductor package 10 according to an embodiment.

Referring to FIG. 1, the semiconductor package 10 may be configured to include a package substrate 100, a base module 200, a lower-left chip 310, an upper-left chip 410, and a packaging encapsulant 190. The semiconductor package 10 may be configured to further include a lower-right chip 350 and an upper-right chip 450.

The lower-left chip 310 may be a chip which is located at a side of the base module 200 opposite to the upper-left chip 410, and the lower-right chip 350 may be a chip which is located at a side of the base module 200 opposite to the upper-right chip 450. The lower-left chip 310 and the lower-right chip 350 may be chips which are disposed on a bottom surface of the base module 200, and the upper-left chip 410 and the upper-right chip 450 may be chips which are disposed on a top surface of the base module 200. The lower-left chip 310 and the lower-right chip 350 may be located to be symmetric with respect to a vertical line (not shown) passing through a central point of the base module 200, and the upper-left chip 410 and the upper-right chip 450 may also be located to be symmetric with respect to the vertical line passing through a central point of the base module 200. In the lower-left chip 310, the lower-right chip 350, the upper-left chip 410, and the upper-right chip 450, the terms "left", "right", "upper", and "lower" are only used to distinguish one chip from another chip.

The semiconductor package 10 may further include bonding wires 150 corresponding to connection members for electrically connecting the base module 200 to the package substrate 100. The semiconductor package 10 may further include inner connectors 500 corresponding to connection members for electrically connecting the base module 200 to the chips 310, 410, 350, and 450.

Some of the inner connectors 500 may be disposed between the base module 200 and the lower-left chip 310 to electrically connect the base module 200 to the lower-left chip 310. Some others of the inner connectors 500 may be disposed between the base module 200 and the lower-right chip 350 to electrically connect the base module 200 to the lower-right chip 350. In addition, the others of the inner connectors 500 may be disposed between the base module 200 and the upper-left chip 410 as well as between the base module 200 and the upper-right chip 450 to electrically connect the base module 200 to the upper-left chip 410 and to electrically connect the base module 200 to the upper-right chip 450. The inner connectors 500 may be conductive bumps.

The base module 200 may be disposed to be vertically spaced apart from the package substrate 100. The lower-left chip 310 and the lower-right chip 350 may be laterally spaced apart from each other and may be disposed between the package substrate 100 and the base module 200. The upper-left chip 410 and the upper-right chip 450 may be laterally spaced apart from each other and may be disposed on a top surface of the base module 200 opposite to the lower-left chip 310 and the lower-right chip 350. A left portion of the base module 200 may be located between the lower-left chip 310 and the upper-left chip 410, and the lower-left chip 310 and the upper-left chip 410 may partially and vertically overlap with each other.

Referring still to FIG. 1, the base module 200 may be configured to include an intermediate chip 210, an encapsulant 290, through vias 230, first redistributed lines (RDLs) 260, and second RDLs 280. The base module 200 may be one member into which the intermediate chip 210 and the through vias 230 are modularized by the encapsulant 290.

The base module 200 may be a member providing a base structure on which the upper-left chip 410 and the upper-right chip 450 are stacked.

The encapsulant 290 may be formed to encapsulate and protect the intermediate chip 210. The encapsulant 290 may be formed by molding an epoxy molding compound (EMC) material. The encapsulant 290 may be formed to reveal a surface 210S of the intermediate chip 210. The base module 200 may be disposed on the package substrate 100 such that the surface 210S of the intermediate chip 210 faces the package substrate 100. The encapsulant 290 may be a layer which is distinguished from the packaging encapsulant 190 and may act as a base encapsulant providing a shape of the base module 200. The packaging encapsulant 190 may be formed on the package substrate 100 to cover and protect the base module 200, the lower-left chip 310, the lower-right chip 350, the upper-left chip 410, and the upper-right chip 450. The packaging encapsulant 190 may also be formed by molding an EMC material.

Figure 2:
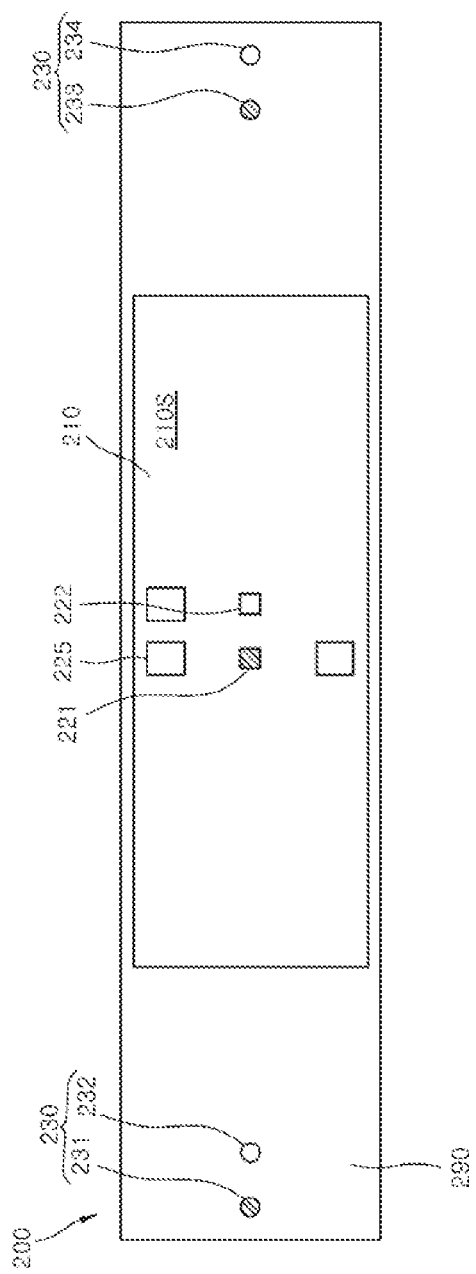
FIGS. 2 and 3 are plan views illustrating a base module included in the semiconductor package illustrated in FIG. 1.
Figure 3:
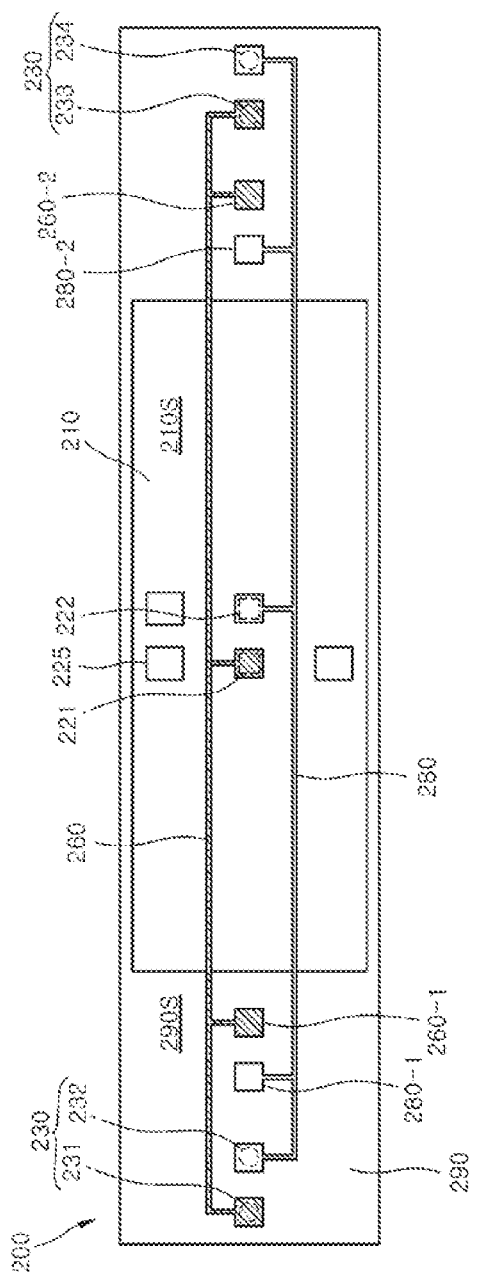

FIG. 2 is a plan view illustrating a layout of the intermediate chip 210 and the through vias 230 included in the base module 200 illustrated in FIG. 1. FIG. 3 is a plan view illustrating a layout of the first and second RDLs 260 and 280 included in the base module 200 illustrated in FIG. 1. FIGS. 2 and 3 are plan views illustrating the base module 200 when viewed in a first direction V1.

Referring to FIGS. 1 and 2, the base module 200 may be configured to include the intermediate chip 210 and the through vias 230 disposed to be spaced apart from the intermediate chip 210. The intermediate chip 210 may be a semiconductor chip including a first intermediate chip pad 221 and a second intermediate chip pad 222 disposed on the surface 210S. Although FIG. 2 illustrates an example in which the first intermediate chip pad 221 and the second intermediate chip pad 222 are disposed to be adjacent to each other, additional intermediate chip pads may be disposed on the surface 210S.

The first intermediate chip pad 221 and the second intermediate chip pad 222 may be connection terminals through which data signals are applied to or outputted from the intermediate chip 210. The other chips, for example, the lower-left chip 310, the lower-right chip 350, the upper-left chip 410, and the upper-right chip 450 may be electrically connected to the first and second intermediate chip pads 221 and 222 through the first and second RDLs 260 and 280. The first and second intermediate chip pads 221 and 222 may be connection terminals through which the intermediate chip 210 communicates with the lower-left chip 310, the lower-right chip 350, the upper-left chip 410, and the upper-right chip 450.

Wire bonding pads 225 may be additionally disposed on the surface 210S to be spaced apart from the first and second intermediate chip pads 221 and 222. The wire bonding pads 225 may be connection terminals to which the bonding wires 150 are connected. As the bonding wires 150 electrically connect the wire bonding pads 225 to the package substrate 100, the intermediate chip 210 may be electrically connected to the package substrate 100. Additional wire bonding pads may be disposed on the surface 210S to be adjacent to the wire bonding pads 225 or the first and second intermediate chip pads 221 and 222.

The through vias 230 may be disposed to be spaced apart from the intermediate chip 210. The through vias 230 may be vertical electrodes that vertically penetrate the encapsulant 290. The through vias 230 may be formed to include a conductive material such as a copper material. First and second through vias 231 and 232 of the through vias 230 may be disposed to be connected to the upper-left chip 410. Third and fourth through vias 233 and 234 of the through vias 230 may be disposed to be connected to the upper-right chip 450. The through vias 230 may provide portions of paths connecting the upper-left chip 410 or the upper-right chip 450 to the intermediate chip 210.

Referring to FIG. 3, the first and second RDLs 260 and 280 may extend to cross over the surface 210S of the intermediate chip 210 and to reach portions of a surface 290S of the encapsulant 290. The first RDL 260 may extend to overlap with the first intermediate chip pad 221 and may be a conductive pattern electrically connected to the first intermediate chip pad 221. The first RDL 260 may further extend to overlap with the first and third through vias 231 and 233 and may be a conductive pattern electrically connected to the first and third through vias 231 and 233. The second RDL 280 may extend to overlap with the second intermediate chip pad 222 and may be a conductive pattern electrically connected to the second intermediate chip pad 222. The second RDL 280 may further extend to overlap with the second and fourth through vias 232 and 234 and may be a conductive pattern electrically connected to the second and fourth through vias 232 and 234. The first RDL 260 may electrically connect the first intermediate chip pad 221 to the first and third through vias 231 and 233, and the second RDL 280 may electrically connect the second intermediate chip pad 222 to the second and fourth through vias 232 and 234.

The first through via 231 may be disposed to correspond to the first intermediate chip pad 221 of the intermediate chip 210 and may be electrically connected to the first intermediate chip pad 221 through the first RDL 260. The second through via 232 may be disposed to correspond to the second intermediate chip pad 222 of the intermediate chip 210 and may be electrically connected to the second intermediate chip pad 222 through the second RDL 280. The third through via 233 may be disposed to correspond to the first intermediate chip pad 221 of the intermediate chip 210, and the first RDL 260 may further extend to electrically connect the first intermediate chip pad 221 to the third through via 233. The fourth through via 234 may be disposed to correspond to the second intermediate chip pad 222 of the intermediate chip 210, and the second RDL 280 may further extend to electrically connect the second intermediate chip pad 222 to the fourth through via 234.

The third through via 233 may be located at a side of the intermediate chip 210 opposite to the second through via 232. The fourth through via 234 may be located at a side of the intermediate chip 210 opposite to the first through via 231. The third through via 233 may be disposed between the fourth through via 234 and the intermediate chip 210.

Referring to FIGS. 2 and 3, the first intermediate chip pad 221 may be disposed such that a distance between the first intermediate chip pad 221 and the first through via 231 is less than a distance between the second intermediate chip pad 222 and the first through via 231. The second through via 232 may be disposed between the first through via 231 and the first intermediate chip pad 221. These position relationships between the first and second through vias 231 and 232 and the first and second intermediate chip pads 221 and 222 may need to electrically connect the intermediate chip 210 to the upper-left chip (410 of FIG. 1). The position relationships between the first and second through vias 231 and 232 and the first and second intermediate chip pads 221 and 222 will be described in more detail later.

The first RDL 260 may extend to detour the second through via 232 in order to electrically connect the first intermediate chip pad 221 to the first through via 231. The second RDL 280 may extend to detour the first intermediate chip pad 221 in order to electrically connect the second intermediate chip pad 222 to the second through via 232. In the event that an additional intermediate chip (not shown) is disposed between the second intermediate chip pad 222 and the first intermediate chip pad 221, the first and second RDLs 260 and 280 may extend to detour even the additional intermediate chip.

Figure 4:
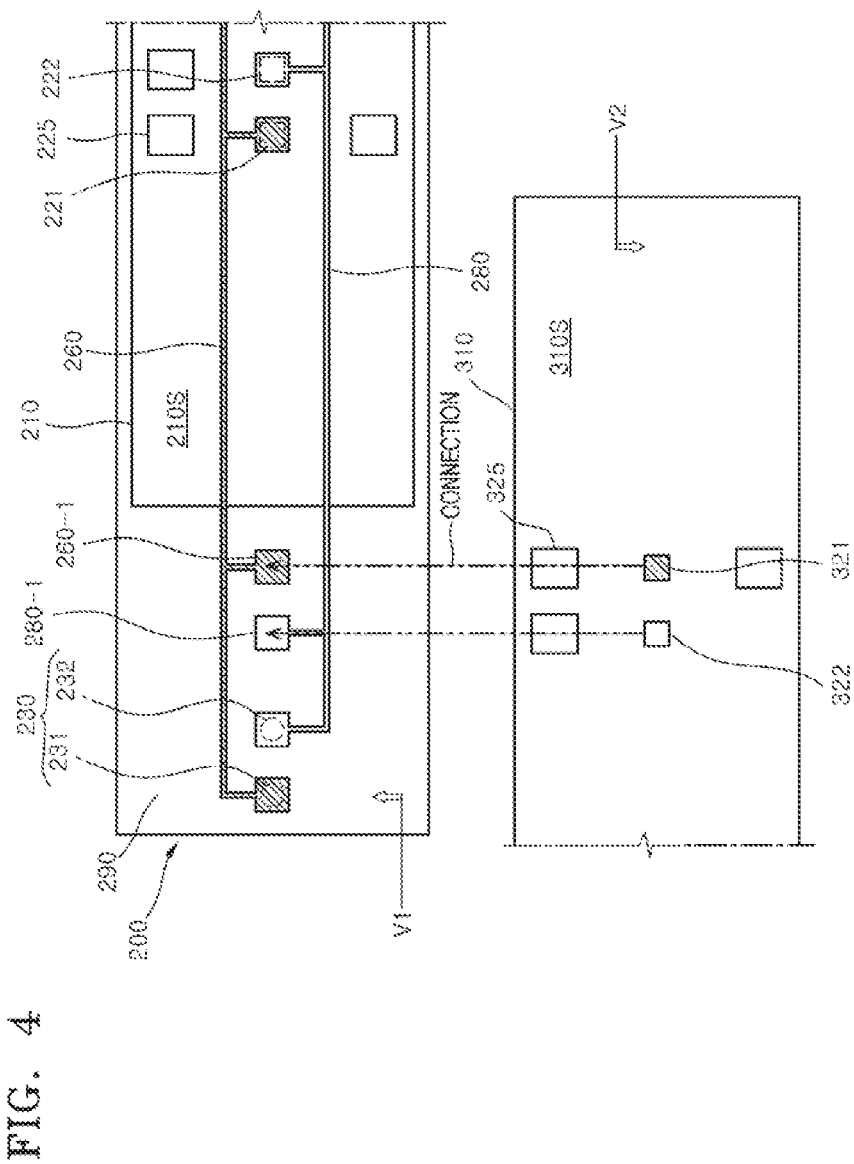
FIG. 4 is a plan view illustrating a connection part between a base module and a lower-left chip included in the semiconductor package illustrated in FIG. 1.

FIG. 4 is a plan view illustrating a connection part between the base module 200 and the lower-left chip 310 included in the semiconductor package 10 illustrated in FIG. 1. The plan view of the base module 200 illustrated in FIG. 4 may correspond to a layout of the base module 200 when viewed in the first direction V1 indicated in FIG. 1, and the plan view of the lower-left chip 310 illustrated in FIG. 4 may correspond to a layout of the lower-left chip 310 when viewed in a second direction V2 indicated in FIG. 1. The first direction V1 and the second direction V2 may be opposite to each other.

Referring to FIGS. 1, 3, and 4, the first and second RDLs 260 and 280 may further extend to provide a first connection part 260-1 and a second connection part 280-1, respectively. The first connection part 260-1 and the second connection part 280-1 may be electrically connected to the lower-left chip 310. Because the lower-left chip 310 is electrically connected to the first connection part 260-1 and the second connection part 280-1, the lower-left chip 310 may be electrically connected to the intermediate chip 210 through the first and second RDLs 260 and 280.

The lower-left chip 310 may be a semiconductor chip including a first lower-left chip pad 321 and a second lower-left chip pad 322 which are disposed on a surface 310S of the lower-left chip 310. The first and second lower-left chip pads 321 and 322 may be electrical connection terminals through which data signals are applied to or outputted from the lower-left chip 310. The first and second lower-left chip pads 321 and 322 may be electrically connected to the first intermediate chip pad 221 and the second intermediate chip pad 222, respectively.

The first lower-left chip pad 321 may be disposed to correspond to the first intermediate chip pad 221 and may be electrically connected to the first intermediate chip pad 221 through the first RDL 260. The first lower-left chip pad 321 may be electrically connected to the first connection part 260-1 by any one of the inner connectors 500. The lower-left chip 310 may be disposed below the base module 200 such that the first connection part 260-1 vertically overlaps with the first lower-left chip pad 321.

The second lower-left chip pad 322 may be disposed to correspond to the second intermediate chip pad 222 and may be electrically connected to the second intermediate chip pad 222 through the second RDL 280. The second lower-left chip pad 322 may be electrically connected to the second connection part 260-2 by one of the inner connectors 500. The second connection part 280-1 may be disposed between the first connection part 260-1 and the second through via 232 such that the second connection part 280-1 vertically overlaps with the second lower-left chip pad 322.

The lower-left chip 310 may be disposed on the package substrate 100 such that the surface 310S of the lower-left chip 310 faces the base module 200. The lower-left chip 310 may partially overlap with the intermediate chip 210 such that a portion of the surface 310S of the lower-left chip 310 faces the surface 210S of the intermediate chip 210. Because the base module 200 is stacked on the lower-left chip 310 such that the surface 310S of the lower-left chip 310 faces the surface 210S of the intermediate chip 210, a distance between the first lower-left chip pad 321 and the first intermediate chip pad 221 may be less than a distance between the first lower-left chip pad 321 and the second intermediate chip pad 222. A distance between the second lower-left chip pad 322 and the first intermediate chip pad 221 may be greater than a distance between the first lower-left chip pad 321 and the first intermediate chip pad 221.

As illustrated in FIG. 4, a disposal sequence of the first and second lower-left chip pads 321 and 322 for which the second lower-left chip pad 322 is located at a left side of the first lower-left chip pad 321 may be opposite to a disposal sequence of the first and second intermediate chip pads 221 and 222 for which the second intermediate chip pad 222 is located at a right side of the first intermediate chip pad 221. As described above, because the disposal sequence of the first and second lower-left chip pads 321 and 322 is opposite to the disposal sequence of the first and second intermediate chip pads 221 and 222, the first and second connection parts 260-1 and 280-1 may also be disposed in a disposal sequence which is opposite to the disposal sequence of the first and second intermediate chip pads 221 and 222 in order to connect the first lower-left chip pad 321 to the first intermediate chip pad 221. As such, the first and second RDLs 260 and 280 may extend to be proper for a layout in which the first and second connection parts 260-1 and 280-1 are disposed in a disposal sequence which is opposite to the disposal sequence of the first and second intermediate chip pads 221 and 222.

Figure 5:
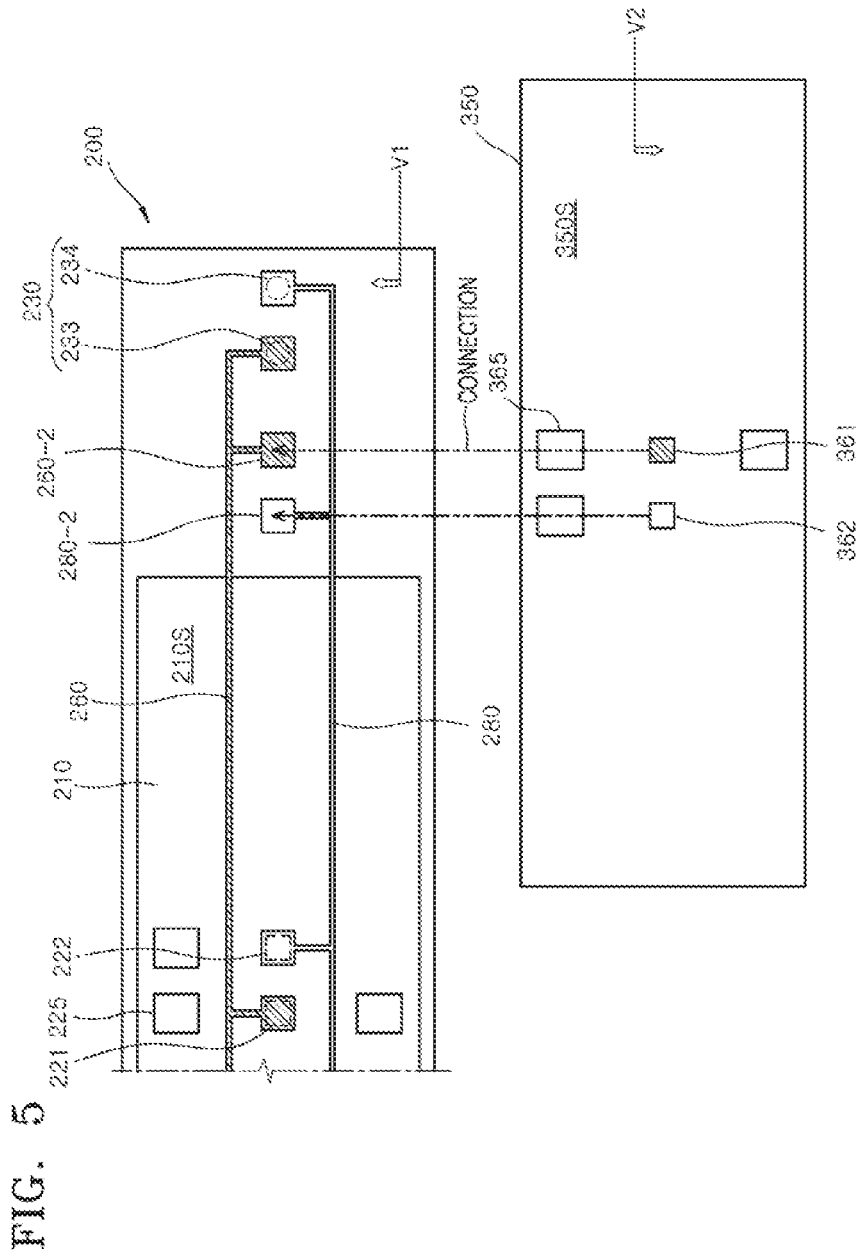
FIG. 5 is a plan view illustrating a connection part between a base module and a lower-right chip included in the semiconductor package illustrated in FIG. 1.

FIG. 5 is a plan view illustrating a connection part between the base module 200 and the lower-right chip 350 included in the semiconductor package 10 illustrated in FIG. 1. The plan view of the base module 200 illustrated in FIG. 5 may correspond to a layout of the base module 200 when viewed in the first direction V1 indicated in FIG. 1, and the plan view of the lower-right chip 350 illustrated in FIG. 5 may correspond to a layout of the lower-right chip 350 when viewed in the second direction V2 indicated in FIG. 1.

Referring to FIGS. 1, 3, and 5, the first and second RDLs 260 and 280 may further extend to provide a third connection part 260-2 and a fourth connection part 280-2, respectively. The third connection part 260-2 and the fourth connection part 280-2 may be electrically connected to the lower-right chip 350. Because the lower-right chip 350 is electrically connected to the third connection part 260-2 and the fourth connection part 280-2, the lower-right chip 350 may be electrically connected to the intermediate chip 210 through the first and second RDLs 260 and 280.

The lower-right chip 350 may be a semiconductor chip including a first lower-right chip pad 361 and a second lower-right chip pad 362 which are disposed on a surface 350S of the lower-right chip 350. The first and second lower-right chip pads 361 and 362 may be electrical connection terminals through which data signals are applied to or outputted from the lower-right chip 350. The first and second lower-right chip pads 361 and 362 may be electrically connected to the first intermediate chip pad 221 and the second intermediate chip pad 222, respectively.

The first lower-right chip pad 361 may be disposed to correspond to the first intermediate chip pad 221 and the first lower-left chip pad 321 and may be electrically connected to the first intermediate chip pad 221 and the first lower-left chip pad 321 through the first RDL 260. Because the first lower-right chip pad 361 is electrically connected to the third connection part 260-2 by any one of the inner connectors 500, the first lower-right chip pad 361 may be electrically connected to the first intermediate chip pad 221 through the first RDL 260. The lower-right chip 350 may be disposed below the base module 200 such that the third connection part 260-2 vertically overlaps with the first lower-right chip pad 361.

The second lower-right chip pad 362 may be disposed to correspond to the second intermediate chip pad 222 and the second lower-left chip pad 322 and may be electrically connected to the second intermediate chip pad 222 and the second lower-left chip pad 322 through the second RDL 280. Because the second lower-right chip pad 362 is electrically connected to the fourth connection part 280-2 by one of the inner connectors 500, the second lower-right chip pad 362 may be electrically connected to the second intermediate chip pad 222 through the second RDL 280. The fourth connection part 280-2 may be disposed between the third connection part 260-2 and the intermediate chip 210 such that the fourth connection part 280-2 vertically overlaps with the second lower-right chip pad 362.

The lower-right chip 350 may be disposed on the package substrate 100 such that the surface 350S of the lower-right chip 350 faces the base module 200. The lower-right chip 350 may partially overlap with the intermediate chip 210 such that a portion of the surface 350S of the lower-right chip 350 faces the surface 210S of the intermediate chip 210. Because the base module 200 is stacked on the lower-right chip 350 such that the surface 350S of the lower-right chip 350 faces the surface 210S of the intermediate chip 210, a distance between the first lower-right chip pad 361 and the second intermediate chip pad 222 may be less than a distance between the first lower-right chip pad 361 and the first intermediate chip pad 221. A distance between the second lower-right chip pad 362 and the second intermediate chip pad 222 may be less than a distance between the first lower-right chip pad 361 and the second intermediate chip pad 222.

As illustrated in FIG. 5, a disposal sequence of the first and second lower-right chip pads 361 and 362 for which the second lower-right chip pad 362 is located at a left side of the first lower-right chip pad 361 may be opposite to a disposal sequence of the first and second intermediate chip pads 221 and 222 for which the second intermediate chip pad 222 is located at a right side of the first intermediate chip pad 221. As such, the first and second RDLs 260 and 280 may extend to be proper for a layout in which the third and fourth connection parts 260-2 and 280-2 are disposed in a disposal sequence which is opposite to the disposal sequence of the first and second intermediate chip pads 221 and 222 in order to connect the first lower-right chip pad 361 to the first intermediate chip pad 221.

Figure 6:
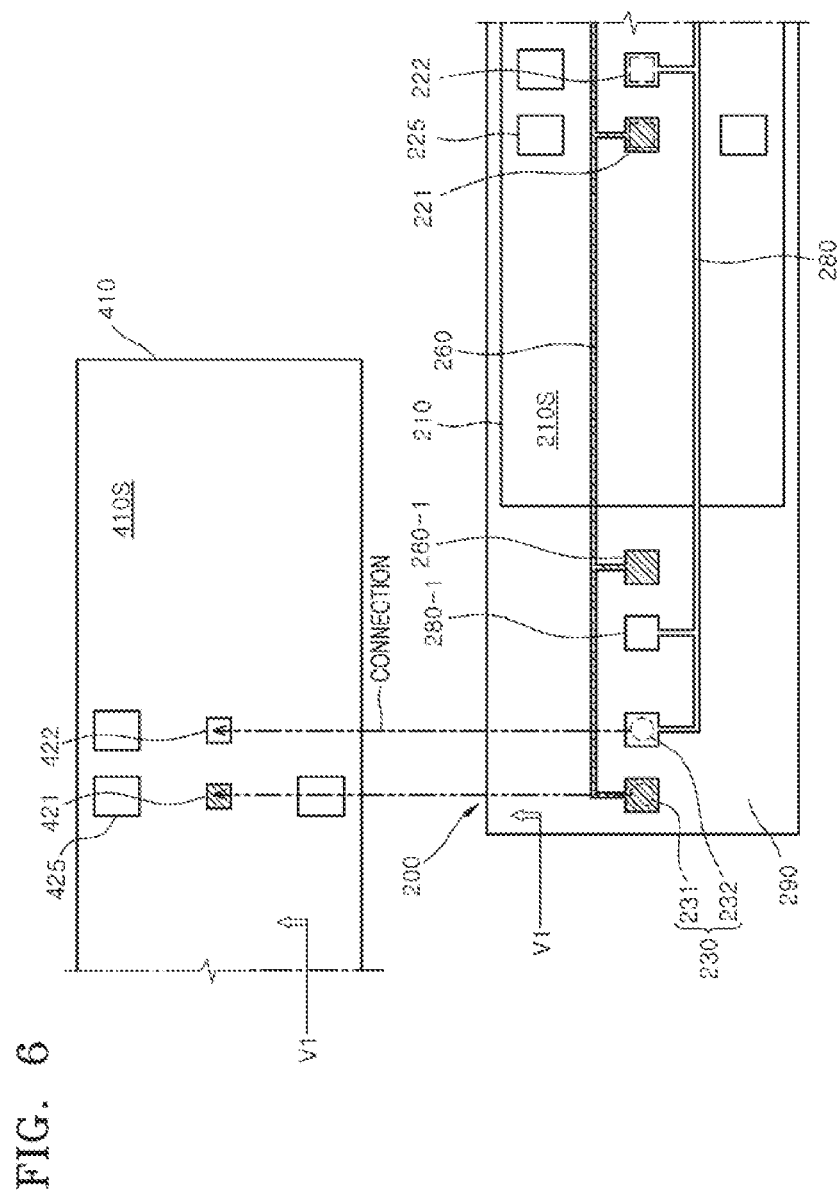
FIG. 6 is a plan view illustrating a connection part between a base module and an upper-left chip included in the semiconductor package illustrated in FIG. 1.

FIG. 6 is a plan view illustrating a connection part between the base module 200 and the upper-left chip 410 included in the semiconductor package 10 illustrated in FIG. 1. The plan views of the base module 200 and the upper-left chip 410 illustrated in FIG. 6 may correspond to layouts of the base module 200 and the upper-left chip 410 when viewed in the first direction V1 indicated in FIG. 1.

Referring to FIGS. 1, 3, and 6, because the upper-left chip 410 is connected to the first and second through vias 231 and 232, the upper-left chip 410 may be electrically connected to the intermediate chip 210 through the first and second RDLs 260 and 280. The upper-left chip 410 may be a semiconductor chip including a first upper-left chip pad 421 and a second upper-left chip pad 422 which are disposed on a surface 410S of the upper-left chip 410.

The first and second upper-left chip pads 421 and 422 may be electrical connection terminals through which data signals are applied to or outputted from the upper-left chip 410. The first upper-left chip pad 421 may be disposed to correspond to the first intermediate chip pad 221 and may be electrically connected to the first intermediate chip pad 221 through the first RDL 260. The first upper-left chip pad 421 may be disposed to correspond to the first lower-left chip pad 321 and the first lower-right chip pad 361 and may be electrically connected to the first lower-left chip pad 321 and the first lower-right chip pad 361 through the first RDL 260.

The second upper-left chip pad 422 may be disposed to correspond to the second intermediate chip pad 222, the second lower-left chip pad 322, and the second lower-right chip pad 362 and may be electrically connected to the second intermediate chip pad 222, the second lower-left chip pad 322, and the second lower-right chip pad 362 through the second RDL 280.

The first upper-left chip pad 421 and the second upper-left chip pad 422 may be electrically connected to respective ones of the first and second through vias 231 and 232 through two of the inner connectors 500. The upper-left chip 410 may be disposed on the base module 200 such that the first upper-left chip pad 421 and the second upper-left chip pad 422 vertically overlap with respective ones of the first and second through vias 231 and 232.

The upper-left chip 410 may be disposed on the base module 200 such that the surface 410S of the upper-left chip 410 faces the base module 200. Because the upper-left chip 410 and the intermediate chip 210 are disposed over the package substrate 100 such that both of the surfaces 410S and 210S of the upper-left chip 410 and the intermediate chip 210 face the package substrate 100, a disposal sequence of the first upper-left chip pad 421 and the second upper-left chip pad 422 may be substantially the same as a disposal sequence of the first intermediate chip pad 221 and the second intermediate chip pad 222. A distance between the first upper-left chip pad 421 and the first intermediate chip pad 221 may be less than a distance between the first upper-left chip pad 421 and the second intermediate chip pad 222. A distance between the second upper-left chip pad 422 and the first intermediate chip pad 221 may be less than a distance between the first upper-left chip pad 421 and the first intermediate chip pad 221.

Referring to FIGS. 4 and 6, a disposal sequence of the first upper-left chip pad 421 and the second upper-left chip pad 422 may be opposite to a disposal sequence of the first lower-left chip pad 321 and the second lower-left chip pad 322. The first lower-left chip pad 321 may be connected to the first connection part 260-1. Because a disposal sequence of the first connection part 260-1 and the second connection part 280-1 is opposite to a disposal sequence of the first intermediate chip pad 221 and the second intermediate chip pad 222, the first upper-left chip pad 421 may share the first RDL 260 with the first lower-left chip pad 321 and may be connected to the first intermediate chip pad 221.

Figure 7:
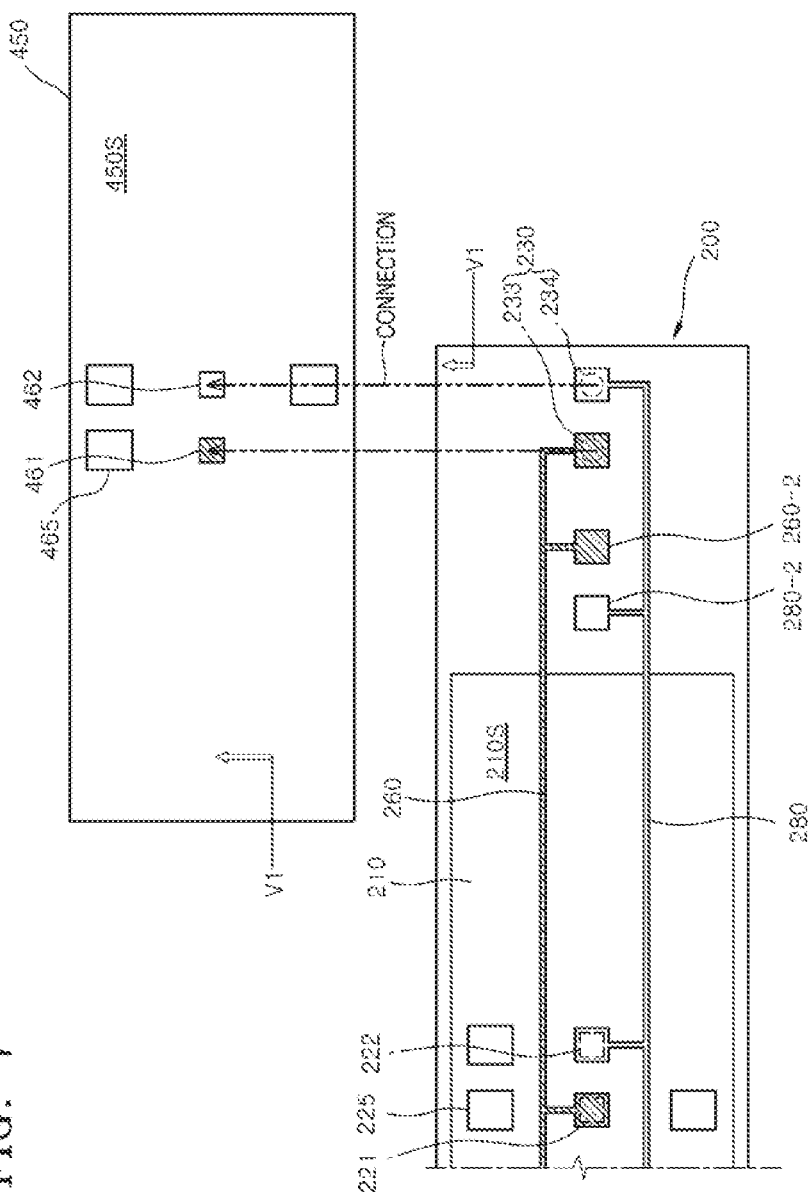
FIG. 7 is a plan view illustrating a connection part between a base module and an upper-right chip included in the semiconductor package illustrated in FIG. 1.

FIG. 7 is a plan view illustrating a connection part between the base module 200 and the upper-right chip 450 included in the semiconductor package 10 illustrated in FIG. 1. The plan views of the base module 200 and the upper-right chip 450 illustrated in FIG. 7 may correspond to layouts of the base module 200 and the upper-right chip 450 when viewed in the first direction V1 indicated in FIG. 1.

Referring to FIGS. 1, 3, and 7, because the upper-right chip 450 is connected to the third and fourth through vias 233 and 234, the upper-right chip 450 may be electrically connected to the intermediate chip 210 through the first and second RDLs 260 and 280. The upper-right chip 450 may be a semiconductor chip including a first upper-right chip pad 461 and a second upper-right chip pad 462 which are disposed on a surface 450S of the upper-right chip 450.

The first and second upper-right chip pads 461 and 462 may be electrical connection terminals through which data signals are applied to or outputted from the upper-right chip 450. The first upper-right chip pad 461 may be disposed to correspond to the first intermediate chip pad 221 and may be electrically connected to the first intermediate chip pad 221 through the first RDL 260. The first upper-right chip pad 461 may be disposed to correspond to the first lower-left chip pad 321, the first lower-right chip pad 361, and the first upper-left chip pad 421 and may be electrically connected to the first lower-left chip pad 321, the first lower-right chip pad 361, and the first upper-left chip pad 421 through the first RDL 260.

The second upper-right chip pad 462 may be disposed to correspond to the second intermediate chip pad 222, the second lower-left chip pad 322, the second lower-right chip pad 362, and the second upper-left chip pad 422 and may be electrically connected to the second intermediate chip pad 222, the second lower-left chip pad 322, the second lower-right chip pad 362, and the second upper-left chip pad 422 through the second RDL 280.

The first upper-right chip pad 461 and the second upper-right chip pad 462 may be electrically connected to respective ones of the third and fourth through vias 233 and 234 through two of the inner connectors 500. The upper-right chip 450 may be disposed on the base module 200 such that the first upper-right chip pad 461 and the second upper-right chip pad 462 vertically overlap with respective ones of the third and fourth through vias 233 and 234.

The upper-right chip 450 may be disposed on the base module 200 such that the surface 450S of the upper-right chip 450 faces the base module 200. Because the upper-right chip 450 and the intermediate chip 210 are disposed over the package substrate 100 such that both of the surfaces 450S and 210S of the upper-right chip 450 and the intermediate chip 210 face the package substrate 100, a disposal sequence of the first upper-right chip pad 461 and the second upper-right chip pad 462 may be substantially the same as a disposal sequence of the first intermediate chip pad 221 and the second intermediate chip pad 222. A distance between the first upper-right chip pad 461 and the first intermediate chip pad 221 may be greater than a distance between the first upper-right chip pad 461 and the second intermediate chip pad 222. A distance between the second upper-right chip pad 462 and the first intermediate chip pad 221 may be greater than a distance between the first upper-right chip pad 461 and the first intermediate chip pad 221.

Referring to FIGS. 5 and 7, a disposal sequence of the first upper-right chip pad 461 and the second upper-right chip pad 462 may be opposite to a disposal sequence of the first lower-right chip pad 361 and the second lower-right chip pad 362. The first lower-right chip pad 361 may be connected to the third connection part 260-2. Because a disposal sequence of the third connection part 260-2 and the fourth connection part 280-2 is opposite to a disposal sequence of the first intermediate chip pad 221 and the second intermediate chip pad 222, the first upper-right chip pad 461 may share the first RDL 260 with the first lower-right chip pad 361 and may be connected to the first intermediate chip pad 221.

In an embodiment, the upper-right chip 450 may be provided as a dummy chip that substantially does not operate. In such a case, the upper-right chip 450 may be provided to keep a balance of the semiconductor package 10.

Referring again to FIGS. 1 and 4, the lower-left chip 310 and the intermediate chip 210 may be semiconductor chips having substantially the same configuration. The lower-left chip 310 and the intermediate chip 210 may be memory semiconductor chips. When the intermediate chip 210 is configured to have a pad array including the first and second intermediate chip pads 221 and 222 and the wire bonding pads 225, the lower-left chip 310 may have substantially the same pad array as the intermediate chip 210 and the pad array of the lower-left chip 310 may be disposed on the surface 310S of the lower-left chip 310. The lower-left chip 310 may include the first and second lower-left chip pads 321 and 322 disposed on the surface 310S to correspond to respective ones of the first and second intermediate chip pads 221 and 222 and may further include wire bonding pads 325 disposed on the surface 310S to correspond to the wire bonding pads 225.

The lower-left chip 310 may be connected to the intermediate chip 210 through the first and second RDLs 260 and 280, may be connected to the bonding wires 150 through the intermediate chip 210, and may be connected to the package substrate 100 through the bonding wires 150. Thus, no bonding wires are connected to the wire bonding pads 325. Because the lower-left chip 310 is connected to the package substrate 100 through the intermediate chip 210, the intermediate chip 210 may act as a master chip that controls transmission of data signals between the lower-left chip 310 and the package substrate 100. The lower-left chip 310 may act as a slave chip whose operation is controlled by the intermediate chip 210.

Because the lower-left chip 310 has substantially the same pad array as the intermediate chip 210, a disposal sequence of the first and second lower-left chip pads 321 and 322 may be opposite to a disposal sequence of the first and second intermediate chip pads 221 and 222 when the lower-left chip 310 and the intermediate chip 210 are disposed such that the surfaces 310S and 210S of the lower-left chip 310 and the intermediate chip 210 face each other as illustrated in FIG. 1. In order to compensate for a disposal sequence of the first and second lower-left chip pads 321 and 322 which is opposite to a disposal sequence of the first and second intermediate chip pads 221 and 222, the first connection part 260-1 and the second connection part 280-1 may be arrayed in a disposal sequence which is opposite to a disposal sequence of the first intermediate chip pad 221 and the second intermediate chip pad 222.

Referring to FIGS. 1 and 5, the lower-right chip 350 and the intermediate chip 210 may be semiconductor chips having substantially the same configuration. The lower-right chip 350 may include a pad array which is disposed on the surface 350S to have substantially the same configuration as a pad array of the first and second intermediate chip pads 221 and 222 and the wire bonding pads 225. The lower-right chip 350 may further include wire bonding pads 365 disposed on the surface 350S to correspond to the wire bonding pads 225 of the intermediate chip 210. The lower-right chip 350 may act as another slave chip whose operation is controlled by the intermediate chip 210. Thus, for an embodiment, no wire bonding pads are connected to the wire bonding pads 365 included in the lower-right chip 350.

Referring to FIGS. 1 and 6, the upper-left chip 410 and the intermediate chip 210 may be semiconductor chips having substantially the same configuration. The upper-left chip 410 may include a pad array which is disposed on the surface 410S to have substantially the same configuration as a pad array of the first and second intermediate chip pads 221 and 222 and the wire bonding pads 225. The upper-left chip 410 may further include wire bonding pads 425 disposed on the surface 410S to correspond to the wire bonding pads 225 of the intermediate chip 210. The upper-left chip 410 may act as yet another slave chip whose operation is controlled by the intermediate chip 210. Thus, for an embodiment, no wire bonding pads are connected to the wire bonding pads 425 included in the upper-left chip 410.

Referring to FIGS. 1 and 7, the upper-right chip 450 and the intermediate chip 210 may be semiconductor chips having substantially the same configuration. The upper-right chip 450 may include a pad array which is disposed on the surface 450S to have substantially the same configuration as a pad array of the first and second intermediate chip pads 221 and 222 and the wire bonding pads 225. The upper-right chip 450 may further include wire bonding pads 465 disposed on the surface 450S to correspond to the wire bonding pads 225 of the intermediate chip 210. The upper-right chip 450 may act as still another slave chip whose operation is controlled by the intermediate chip 210. Thus, for an embodiment, no wire bonding pads are connected to the wire bonding pads 465 included in the upper-right chip 450.

As described above, the lower-left chip 310, the upper-left chip 410, the lower-right chip 350, and the upper-right chip 450 may be connected to the package substrate 100 through the intermediate chip 210. The upper-left chip 410, the lower-right chip 350, and the upper-right chip 450 may be indirectly connected to the package substrate 100. The base module 200 may provide the first and second RDLs 260 and 280 corresponding to paths that connect the lower-left chip 310 and the lower-right chip 350 to the intermediate chip 210. The base module 200 may provide the first and second RDLs 260 and 280 corresponding to paths that connect the upper-left chip 410 and the upper-right chip 450 to the intermediate chip 210.

Referring again to FIG. 1, the package substrate 100 may be configured to further include a through slit 105. The through slit 105 may be located to overlap with the wire bonding pads 225 of the intermediate chip 210 when viewed from a plan view. The package substrate 100 may have a first surface 101 facing the base module 200 and a second surface 102 located at an opposite side of the first surface 101. The through slit 105 may have a hole shape or an opening shape penetrating from the first surface 101 to the second surface 102. The package substrate 100 may further include bond fingers 151 disposed on the second surface 102.

The bonding wires 150 may be provided to connect the wire bonding pads 225 to the bond fingers 151. Because the base module 200 is disposed on the first surface 101 of the package substrate 100, the bonding wires 150 may be disposed to face the first surface 101. In order to connect the wire bonding pads 225 to the bond fingers 151 disposed on the second surface 102 of the package substrate 100 opposite to the base module 200, the bonding wires 150 may extend via the through slit 105. The lower-left chip 310 and the lower-right chip 350 may be disposed on the first surface 101 of the package substrate 100 to be spaced apart from each other by the through slit 105. The bonding wires 150 may extend via a space between the lower-left chip 310 and the lower-right chip 350 as well as via the through slit 105.

The packaging encapsulant 190 may extend to fill the through slit 105 and to cover the bonding wires 150 and the bond fingers 151. The package substrate 100 may further include ball lands 159 that are disposed on the second surface 102 to be spaced apart from the bond fingers 151. Outer connectors 109 such as solder balls may be attached to the ball lands 159.

Referring to FIG. 1, the lower-left chip 310 may be disposed between the base module 200 and the package substrate 100, and the upper-left chip 410 may be disposed on a surface of the base module 200 opposite to the lower-left chip 310. In an embodiment, the semiconductor package 10 may be configured without the lower-right chip 350 and the upper-right chip 450. The base module 200 may be configured to include the through vias 230 that penetrate the encapsulant 290 to be connected to the upper-left chip 410. The base module 200 may further include the RDLs 260 and 280 connecting the intermediate chip 210 to the through vias 230. The RDLs 260 and 280 may extend to provide the connection parts 260-1 and 280-1 that are spaced apart from the through vias 230. The lower-left chip 310 may be electrically connected to the connection parts 260-1 and 280-1.

According to the above embodiments, there are provided a base module including an electrical connection structure comprised of through vias and RDLs and including a semiconductor chip connected to the electrical connection structure. At least two additional semiconductor chips are respectively disposed above and below the base module to provide a semiconductor package. The additional semiconductor chips may be electrically connected to the semiconductor chip, which is included in the base module, by the through vias and the RDLs.

Figure 8:
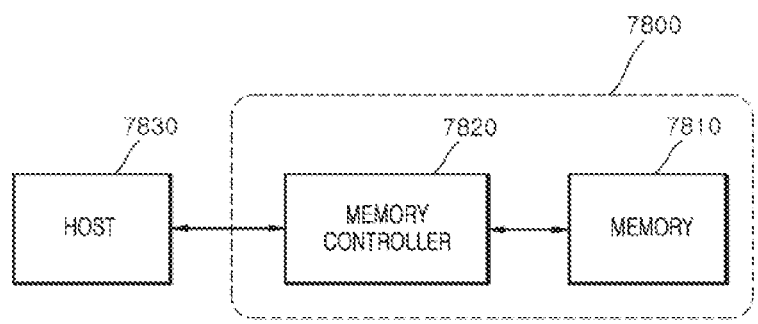
FIG. 8 is a block diagram illustrating an electronic system employing a memory card including a semiconductor package according to an embodiment.

FIG. 8 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include one or more semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
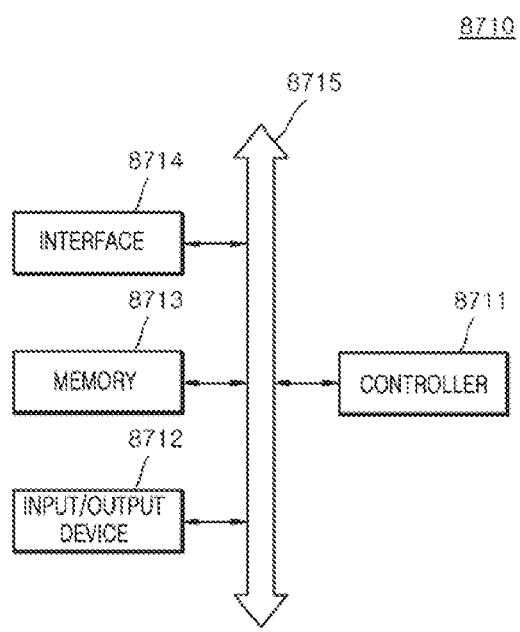
FIG. 9 is a block diagram illustrating another electronic system including a semiconductor package according to an embodiment.

FIG. 9 is a block diagram illustrating an electronic system 8710 including at least one of the semiconductor packages according to the embodiments. The electronic system 8710 may include a controller 8711, an input/output unit 8712, and a memory 8713. The controller 8711, the input/output unit 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
    a package substrate;
    a base module disposed on the package substrate;
    a lower-left chip and a lower-right chip disposed between the base module and the package substrate; and
    an upper-left chip disposed on the base module opposite to the lower-left chip,
    wherein the base module includes:
        an intermediate chip having a first intermediate chip pad and a second intermediate chip pad;
        an encapsulant encapsulating the intermediate chip;
        a first through via and a second through via penetrating the encapsulant to be electrically connected to the upper-left chip; and
        a first redistributed line (RDL) and a second RDL configured to connect the first and second intermediate chip pads to respective ones of the first and second through vias and configured to be electrically connected to the lower-left chip and the lower-right chip.

2. The semiconductor package of claim 1,
    wherein a distance between the first intermediate chip pad and the first through via is less than a distance between the second intermediate chip pad and the first through via;
    wherein the second through via is disposed between the first through via and the first intermediate chip pad;
    wherein the first RDL extends to detour the second through via; and
    wherein the second RDL extends to detour the first intermediate chip pad.

3. The semiconductor package of claim 2,
    wherein the lower-left chip includes a first lower-left chip pad corresponding to the first intermediate chip pad and a second lower-left chip pad corresponding to the second intermediate chip pad;
    wherein the first RDL provides a first connection part connected to the first lower-left chip pad;
    wherein the first connection part is disposed between the second through via and the first intermediate chip pad to overlap with the first lower-left chip pad;
    wherein the second RDL provides a second connection part connected to the second lower-left chip pad; and
    wherein the second connection part is disposed between the first connection part and the second through via to overlap with the second lower-left chip pad.

4. The semiconductor package of claim 3, wherein the lower-left chip is disposed to partially overlap with the intermediate chip such that:
    a distance between the first lower-left chip pad and the first intermediate chip pad is less than a distance between the first lower-left chip pad and the second intermediate chip pad; and
    a distance between the second lower-left chip pad and the first intermediate chip pad is greater than a distance between the second lower-left chip pad and the first intermediate chip pad.

5. The semiconductor package of claim 3, wherein the lower-right chip includes:
    a first lower-right chip pad disposed to correspond to the first intermediate chip pad and the first lower-left chip pad such that a distance between the first lower-right chip pad and the second intermediate chip pad is less than a distance between the first lower-right chip pad and the first intermediate chip pad; and
    a second lower-right chip pad disposed to correspond to the second intermediate chip pad and the second lower-left chip pad such that a distance between the second lower-right chip pad and the second intermediate chip pad is less than a distance between the second lower-right chip pad and the first intermediate chip pad,
    wherein the first RDL extends to provide a third connection part connected to the first lower-right chip pad;
    wherein the third connection part overlaps with the first lower-right chip pad;
    wherein the second RDL extends to provide a fourth connection part connected to the second lower-right chip pad; and
    wherein the fourth connection part overlaps with the second lower-right chip pad.

6. The semiconductor package of claim 5, wherein the base module further includes:
    a third through via disposed on the intermediate chip opposite to the second through via to correspond to the first through via and connected to the first RDL; and
    a fourth through via disposed on a side of the intermediate chip opposite to the first through via to correspond to the second through via and connected to the second RDL,
    wherein the third through via is disposed between the second intermediate chip pad and the fourth through via.

7. The semiconductor package of claim 6, wherein the upper-left chip includes:

a first upper-left chip pad connected to the first through via and disposed to correspond to the first intermediate chip pad, the first lower-left chip pad, and the first lower-right chip pad; and a second upper-left chip pad connected to the second through via and disposed to correspond to the second intermediate chip pad, the second lower-left chip pad, and the second lower-right chip pad.

8. The semiconductor package of claim 7, further comprising an upper-right chip disposed on the base module opposite to the lower-right chip to be spaced apart from the upper-left chip, wherein the upper-right chip includes:

a first upper-right chip pad connected to the third through via and disposed to correspond to the first intermediate chip pad, the first lower-left chip pad, the first lower-right chip pad, and the first upper-left chip pad; and a second upper-right chip pad connected to the fourth through via and disposed to correspond to the second intermediate chip pad, the second lower-left chip pad, the second lower-right chip pad, and the second upper-left chip pad.

9. The semiconductor package of claim 6, further comprising a dummy chip connected to the third through via and the fourth through via.

10. The semiconductor package of claim 1, further comprising conductive bumps connecting the upper-left chip to the first and second through vias.

11. The semiconductor package of claim 1, wherein the intermediate chip further includes wire bonding pads disposed to be spaced apart from the first and second intermediate chip pads; and wherein the semiconductor package further includes bonding wires connecting the package substrate to the wire bonding pads.

12. The semiconductor package of claim 11, wherein the package substrate comprises:

a through slit penetrating a portion of the package substrate to overlap with the wire bonding pads; and bond fingers disposed on a surface of the package substrate opposite to the base module to be adjacent to the through slit, wherein the bonding wires pass through the through slit to connect the wire bonding pads to the bond fingers.

13. The semiconductor package of claim 11, wherein the lower-left chip includes a pad array having substantially the same configuration as a pad array which is comprised of the first and second intermediate chip pads and the wire bonding pads.

14. A semiconductor package comprising:

a package substrate;

a base module disposed on the package substrate and configured to include an intermediate chip;

bonding wires connecting the intermediate chip to the package substrate;

a lower-left chip disposed between the base module and the package substrate; and an upper-left chip disposed on the base module opposite to the lower-left chip, wherein the intermediate chip includes:

a first intermediate chip pad and a second intermediate chip pad; and wire bonding pads disposed to be spaced apart from the first and second intermediate chip pads and connected to the bonding wires, wherein the lower-left chip includes:

a first lower-left chip pad corresponding to the first intermediate chip pad; and a second lower-left chip pad corresponding to the second intermediate chip pad, wherein the upper-left chip includes:

a first upper-left chip pad corresponding to the first intermediate chip pad; and a second upper-left chip pad corresponding to the second intermediate chip pad, wherein the base module further includes:

an encapsulant encapsulating the intermediate chip;

a first through via and a second through via penetrating the encapsulant to be electrically connected to respective ones of the first upper-left chip pad and the second upper-left chip pad;

a first redistributed line (RDL) configured to connect the first intermediate chip pad to the first through via and configured to extend to provide a first connection part which is spaced apart from the first through via and is connected to the first lower-left chip pad; and a second RDL configured to connect the second intermediate chip pad to the second through via and configured to extend to provide a second connection part which is disposed between the second through via and the first connection part and is connected to the second lower-left chip pad.

15. The semiconductor package of claim 14, wherein a distance between the first intermediate chip pad and the first through via is less than a distance between the second intermediate chip pad and the first through via;

wherein the second through via is disposed between the first through via and the first intermediate chip pad;

wherein the first RDL extends to detour the second through via; and wherein the second RDL extends to detour the first intermediate chip pad.

16. The semiconductor package of claim 15, wherein the lower-left chip is disposed to partially overlap with the intermediate chip such that:

a distance between the first lower-left chip pad and the first intermediate chip pad is less than a distance between the first lower-left chip pad and the second intermediate chip pad;

and a distance between the second lower-left chip pad and the first intermediate chip pad is greater than a distance between the second lower-left chip pad and the first intermediate chip pad.

17. The semiconductor package of claim 14, further comprising conductive bumps connecting the upper-left chip to the first and second through vias.

18. The semiconductor package of claim 14, wherein the package substrate comprises:

a through slit penetrating a portion of the package substrate to overlap with the wire bonding pads; and bond fingers disposed on a surface of the package substrate opposite to the base module to be adjacent to the through slit, wherein the bonding wires pass through the through slit to connect the wire bonding pads to the bond fingers.

19. A semiconductor package comprising:

a package substrate;

a base module disposed on the package substrate and configured to include an intermediate chip;

bonding wires connecting the intermediate chip to the package substrate;

a lower-left chip disposed between the base module and the package substrate; and an upper-left chip disposed on the base module, wherein the base module further includes:
- an encapsulant encapsulating the intermediate chip;
- through vias penetrating the encapsulant to be electrically connected to the upper-left chip; and
- redistributed lines (RDLs) configured to connect the intermediate chip to the through vias and configured to extend to provide connection parts which are spaced apart from the through vias and are connected to the lower-left chip.

20. The semiconductor package of claim 19, wherein the package substrate includes:

a through slit penetrating a portion of the package substrate; and bond fingers disposed on a surface of the package substrate opposite to the base module to be adjacent to the through slit, wherein the semiconductor package further includes bonding wires passing through the through slit to connect the intermediate chip to the bond fingers.

* * * * *